United States Patent

Jean et al.

[11] Patent Number: 5,079,194
[45] Date of Patent: Jan. 7, 1992

[54] CRYSTAL GROWTH INHIBITOR FOR GLASSY LOW DIELECTRIC INORGANIC COMPOSITION

[75] Inventors: Jau-Ho Jean, Export; Tapan K. Gupta, Monroeville, both of Pa.

[73] Assignee: Aluminum Company of America, Pittsburgh, Pa.

[21] Appl. No.: 595,986

[22] Filed: Oct. 11, 1990

[51] Int. Cl.⁵ .............................................. C03C 14/00
[52] U.S. Cl. ............................... 501/17; 501/21; 501/32; 501/66; 501/70
[58] Field of Search ............ 501/16, 17, 32, 53, 501/54, 55, 65, 66, 67, 68, 69, 21, 70, 128, 153, 154

[56] References Cited

U.S. PATENT DOCUMENTS

| | | | |
|---|---|---|---|
| 3,926,648 | 12/1975 | Miller | 106/39.6 |
| 4,547,625 | 10/1985 | Tosaki et al. | 174/68.5 |
| 4,642,148 | 2/1987 | Kurihara et al. | 156/89 |
| 4,672,152 | 6/1987 | Shinohara et al. | 174/68.5 |
| 4,755,490 | 7/1988 | DiLizzaro | 501/17 |
| 4,764,233 | 8/1988 | Ogihara et al. | 501/65 |
| 4,788,046 | 11/1988 | Barringer et al. | 423/122 |
| 4,849,379 | 7/1989 | McCormick | 501/20 |
| 4,879,261 | 11/1989 | Burn | 501/32 |

FOREIGN PATENT DOCUMENTS

| | | | |
|---|---|---|---|
| 3248199 | 10/1988 | Japan | . |
| 1-179740 | 7/1989 | Japan | 501/32 |
| 386872 | 12/1973 | U.S.S.R. | 501/16 |

*Primary Examiner*—William R. Dixon, Jr.
*Assistant Examiner*—Paul Marcantoni
*Attorney, Agent, or Firm*—David W. Pearce-Smith

[57] ABSTRACT

A ceramic composition for forming a ceramic dielectric body having a dielectric constant of less than about 4.2 and a TCE of less than about 4.0 ppm/c. The composition comprises a mixture of finely divided particles of 25-50 weight percent borosilicate glass and 50-75 weight percent high silica glass and 1-25 weight percent sufficient of crystalline ceramic material to inhibit the formation of crystalline forms of silica. The high silica glass contains essentially 0.5-1 wt. % alumina, 1-5 wt. % $B_2O$ and approximately 95-98 wt. % $SiO_2$. The mixture is fired at a temperature of less than 1000° C.

14 Claims, 1 Drawing Sheet

CRYSTAL GROWTH INHIBITOR FOR GLASSY LOW DIELECTRIC INORGANIC COMPOSITION

FIELD OF THE INVENTION

The invention relates to dielectric compositions. More particularly the invention relates to glass and ceramic materials that are sintered at low temperatures to produce dense bodies having low coefficients of thermal expansion and a dielectric constant below 4.2.

BACKGROUND OF THE INVENTION

Conventionally, alumina ($Al_2O_3$) is used as a dielectric material for microelectronic packages. It has excellent electrical (insulating), thermal and mechanical (especially strength) properties. Alumina based packages generally containing 4-10 wt. % glass, require sintering temperatures above 1500° C., which necessitates the use of refractory metals such as molybdenum or tungsten for the electrical interconnections so that the metal can be co-fired with the package. These metals have poor electrical conductivity as compared to highly conductive metals such as copper, and secondly, they require the use of strongly reducing atmospheres during co-firing necessitating, expensive furnace systems.

The development of multilayer ceramic circuit boards is toward higher frequency, higher density and higher speed devices. $Al_2O_3$ has a relatively high dielectric constant of about 9.9, causing high signal propagation delay and low signal-to-noise ratio (crosstalk). The signal propagation delay (t) in ceramic substrates is affected by the effective dielectric constant of the substrate (k') in the following equation:

$$t = (k')^{0.5}/C$$

where C is the speed of light. It can be found that the signal propagation delay can be dramatically reduced by a reduction in the effective dielectric constant of the substrate. For example, if the dielectric constant of a material is reduced from 10 (approximately the k' of $Al_2O_3$) to 5, the signal propagation delay can be reduced by 30%. A small signal delay is especially important for the substrate housing a chip with a very dense integrated circuit, for instance, very large scale integrated circuit (VLSI).

Furthermore, alumina has a coefficient of thermal expansion of about $7.4 \times 10^6$/°C. (in the 20°-200° C. range) as compared to $3.4 \times 10^6$/°C. for silicon. This mismatch in thermal expansion results in design constraints and reliability concerns when attaching a silicon wafer to the substrate.

Heretofore, most of the dielectric materials used in multilayer circuits have been conventional thick film compositions. A typical circuit is constructed by sequentially printing, drying and firing functional thick film layers atop a ceramic substrate which is usually 92-96 wt. % $Al_2O_3$. The multiple steps required make this technology process intensive with the large number of process steps and yield losses contributing to high costs. Thick film technology nevertheless fills an important need in microelectronics and will continue to do so in the foreseeable future.

Recently, dielectric thick film compositions with a low dielectric constant of 5 have been introduced. However, ceramic substrates with low dielectric constants less than 4.5 and thermal expansion coefficients equal to that of silicon (3.4 ppm/°C.) are not readily available.

Low temperature co-fired (LTCF) technology has been recently introduced as a method for fabricating multilayer circuits. This technology offers the combination of the processing advantages of HTCF technology and the materials advantages of thick film technology. These LTCF tape systems have firing temperatures below 1000° C. and allow the use of high conductivity metals such as silver, gold, silver/palladium and copper (copper, however, requires reducing atmospheres). Most of these tape systems have dielectric constants between 6 and 8 and encompass a range of thermal coefficient of expansion (TCE).

Currently, there is no readily available low temperature co-fired dielectric tape system using a glass plus ceramic approach that offers both low dielectric constant (less than 4.5) and a TCE matched to silicon (3.4 ppm/°C.).

PRIOR ART

A method for producing a multilayer ceramic circuit board for use with copper conductors is described in U.S. Pat. No. 4,642,148, issued to Kurihara et al. Ceramic compositions comprising 10-75 wt. % alpha-alumina, 5-70 wt. % non-crystalline quartz (fused silica), 20-60 wt. % borosilicate glass are disclosed. The dielectric constants of the fired materials ranged from 4.8 to 9.6.

U.S. Pat. No. 4,672,152, issued to Shinohara, et al describes a multilayer ceramic circuit board in which the ceramic is prepared from a mixture of 50-95 wt. % crystallizable glass and 5-50 wt. % ceramic filler. The material has a dielectric constant between 5.1 and 6.0 and a flexural strength above 150 MPa. The crystallizable glass consists of 5-20 wt. % lithium oxide, 60-90 wt. % silicon dioxide, 1-10 wt. % aluminum oxide and 1-5 wt. % alkaline metal oxide other than lithium oxide. The ceramic filler is selected from the group of silicon dioxide, $\beta$-eucryptite ($LiAlSiO_4$) and aluminum oxide.

U.S. Pat. No. 3,926,648, issued to Miller, describes a process for sintering powdered crystallizable glasses having compositions approximating the stoichiometry of cordierite ($2MgO.2Al_2O_3.5SiO_2$) into cordierite. The cordierite bodies exhibit low coefficients of thermal expansion and contain hexagonal cordierite as the crystal phase.

U.S. Pat. No. 4,755,490, issued to DiLazzaro, describes a low firing temperature ceramic materials having dielectric constants between 4.5 and 6.1. The materials had coefficient of thermal expansion between 3.9 and 4.2 cm/cm/°C. $\times 10^6$. Example 11 shows k'=4.5 and TCE=3.9. The material is formed from a mixture of 10-50 wt. % alumina, 0-30 wt. % fused silica and 50-60 wt. % (approximately 60-70 vol. %) of a frit composed of about 4 wt. % CaO, about 12 wt. % MgO, about 29 wt. % $B_2O_3$, and about 42 wt. % $SiO_2$. The compositions are fired at a temperature below 1000° C.

U.S. Pat. No. 4,788,046, issued to Barringer et al, describes a glass-ceramic packages for integrated circuits having low sintering temperature. The sintered compositions are formed by coating ceramic particles with glass, separating the coated particles from the glass and then forming the coated particles into a green compact. The material with the lowest dielectric constant (4.5) is obtained using quartz. This material has had a thermal expansion coefficient greater than 5.5.

U.S. Pat. No. 4,849,379, issued to McCormick, describes a composition for making low dielectric layers which is an admixture of finely divided solids. McCormick states that materials such as cordierite and mullite are not suitable for use on $Al_2O_3$ substrates because of TCE mismatch. In addition, McCormick states that compositions containing cordierite and mullite in conjunction with a low softening point glass in general tend to raise TCE, lower firing temperature and increase the dielectric constant of the composition.

U.S. Pat. No. 4,879,261, issued to Burn, describes a low dielectric material having a dielectric less than 5.0. The material is formed from a mixture of finely divided particles consisting essentially of 70–85 wt. % silica and 15–30 wt. % zinc borax flux which is fired to 1065° C. in an oxidizing atmosphere. The composition can be used to make green tape and multilayer devices having internal copper conductors such as multilayer capacitors and multilayer interconnects.

From the foregoing, it can be seen that there is a substantial need for a low temperature co-fireable tape dielectric which (1) has a low dielectric constant (less than 4.5), (2) has a thermal expansion coefficient very close to the value for silicon (3.4 ppm/°C.), and (3) can be fired in air at a low temperature (less than 950° C.), thus permitting the use of high conductivity metallurgies such as gold, silver and silver/palladium.

The principal object of the invention is to provide a material that can be sintered into a body that has a dielectric constant of less than 4.2 at 1 MHz, a thermal expansion coefficient below 4.0 ppm/°C.).

Another object of the invention is to provide ceramic materials that are sintered at temperatures less than 950° C. for 4–20 hours without significantly increasing their thermal coefficient of expansion.

Another object of the invention is to provide ceramic materials that are sintered at low temperatures to produce dense bodies (greater than 95% of theoretical density) having low coefficients of thermal expansion and a dielectric constant below 4.2 and have a glass content below 40 vol. %. A reduction in the glass content of the sintered body is very desirable in that the glassy phase is responsible for shape distortion or warpage during co-firing. If the sintered body is to be used in an electronic package, the shape distortion associated with high volume percent glass content can cause the via holes to misalign during co-firing of the metal and ceramic. A glass content below 50 vol. % will reduce the likelihood that warpage will occur.

SUMMARY OF THE INVENTION

The invention is directed to a ceramic composition for forming a ceramic dielectric body having a dielectric constant of less than about 4.2 at 1 MHz and a TCE of less than about 4.0 ppm/c, the composition being co-fireable with high conductivity metals such as gold, silver and silver/palladium. The composition comprises a mixture of finely divided particles of 25–50 vol. % borosilicate glass, 50–75 vol. % high silica glass and sufficient amounts of crystalline ceramic material to inhibit the formation of crystalline forms of silica.

In a second aspect, the invention is directed to an unfired green tape comprising the above composition dispersed in a polymeric binder that can be fired for periods of time well in excess of four hours without increasing its TCE.

In a further aspect, the invention is directed to a multilayer ceramic substrate comprising layers of the above composition and interconnected conductor layers of copper therebetween, the assemblage having been fired in excess of four hours to form a dense hermetic structure.

In a yet another aspect, the invention is directed to a multilayer ceramic capacitor comprising layers of the above composition with conductor layers of copper therebetween, the assemblage having been fired to form a dense hermetic structure.

BRIEF DESCRIPTION OF THE DRAWINGS

Other features of the present invention will be further described or rendered obvious in the following relating description of the preferred embodiments which is to be considered together with the accompanying drawings, wherein.

DETAILED DESCRIPTION OF THE INVENTION

The preferred glass plus ceramic composition of the present invention comprises a mixture of two principal components: borosilicate glass and high silica glass. The percentages of each component may be varied within the ranges delineated below, depending on the final desired properties of the fired ceramic material. In addition to the two principal components, the present invention includes sufficient amounts of a third material, a crystalline ceramic, which acts to suppress the formation of crystalline forms of silica during the firing of the mixture of the borosilicate and high silica glass.

Dense ceramic bodies can be formed from such compositions by normal manufacturing techniques and low temperature (i.e., 850°–1000° C.) sintering. In a preferred application of the invention, such a mixture is formed into a thin tape, via holes punched through the tape at desired locations, and one or more metal conductor paths are formed on the punched tape. Suitable metals for the conductor paths include copper, silver, gold, platinum/gold and palladium/silver. The tape is subsequently sintered at low temperature, typically after two or more sections have been laminated together to form a multilayer circuit substrate.

It has been found that low firing temperature glass plus ceramic compositions can be made from mixtures containing less than 50 vol. % borosilicate glass. As stated above, a reduction in the glass content of the sintered body is very desirable in which the glassy phase is responsible for shape distortion or warpage during co-firing. A glass content below 50 vol. % will reduce the likelihood that warpage and misalignment of via holes will occur. Low firing temperature glass plus ceramic compositions of the invention are produced by providing a mixture of powdered ingredients, including 25–50 vol. % borosilicate glass and 50–75 vol. % high silica glass and sufficient amounts of crystalline ceramic materials to inhibit the formation of crystalline forms of silica.

The borosilicate glass being composed of $Al_2O_3$, $B_2O_3$, $CaO$, $K_2O$, $Li_2O$, $Na_2O$ and $SiO_2$ in amounts such that the mixture has a softening point of about 800° C. A quantity of the mixture is then formed into a desired shape using conventional procedures, and sintered at a temperature of at least 850° C., preferably 850°–950° C., and most preferably 900°–950° C. The sintering may be conducted in an oxidizing, neutral or reducing atmosphere.

The term "glass plus ceramic" is used herein to describe a sintered ceramic composition which is formed from a mixture of crystalline ceramics and glass. The ceramic and glass phases of the "glass plus ceramic" composition remain distinct after firing. The glass in a "glass plus ceramic" system retains its glassy characteristic after firing and is said to be a non-crystallizable glass in that composition. The ceramic in a "glass plus ceramic" system need not be a crystalline material; it may also be a glass. The ceramic, whether glassy or crystalline in nature, retains its initial characteristic after firing and is said to behave as a ceramic in that fired composition. The term "glass plus ceramic" is used herein to distinguish systems containing non-crystallizable glasses from "glass-ceramic" systems in which the glass undergoes a controlled devitrification during firing and becomes crystalline.

The term "borosilicate glass" is used herein to describe a family of glasses containing 20–35 weight percent boron oxide ($B_2O_3$) and 60–75 weight percent silicon oxide ($SiO_2$).

The term "high silica glass" is used herein to describe a family of glasses containing greater than 95 weight percent silicon oxide ($SiO_2$) and contains 3–4 wt. % $B_2O_3$ and 0–1 wt. % $Al_2O_3$. "High silica glass" has a softening point greater than 1500° C. and does not devitrify when used in a ceramic composition which is fired below 1000° C. "High silica glass" can therefore be said to behave like a crystalline ceramic filler since it remains distinct from the other ceramic components of the material. When the term glass plus ceramic is used in reference to the present application, the "high silica glass" is the ceramic component.

"High silica glass" is different from "fused silica glass" in that "fused silica glass" contains virtually 100% $SiO_2$. For the purposes of the current invention, the difference between "high silica glass" and "fused silica glass" is critical. A "fused silica glass" has a stronger tendency to devitrify and forms crystallites of cristobalite at elevated temperatures than does a "high silica glass".

The cristobalite and quartz phases formed during firing remains in the material on cooling. Cristobalite has a TCE of about $50 \times 10^6/°C$. (in the 20°–300° C. range) and quartz has a TCE of about $13 \times 10^6/°C$. as compared to $3.5 \times 10^6/°C$. for silicon. The presence of cristobalite and/or quartz in the fired product raises the TCE and lowers the mechanical strength of the product. The loss of mechanical strength is due to the volume change associated with phase transformation which generates microcracks.

The term "crystalline ceramic material" is used herein to describe a family of refractory ceramic materials containing low levels of elements selected from Group IA of the periodic table. The term "crystalline ceramic material" is intended to include, but is not limited to alumina ($Al_2O_3$), barium oxide (Bao), cordierite ($Mg_2Al_4Si_5O_{18}$), magnesium oxide (MgO), titania ($TiO_2$), mullite ($Al_6Si_2O_{13}$), magnesium titanate ($MgTiO_3$), spinel ($MgAl_2O_4$), forsterite ($2MgO.SiO_2$), steatite ($MgO.Si_2$), aluminum phosphate ($AlPO_4$), aluminum titanate ($Al_2TiO_5$), dolomite ($CaCO_3.MgCO_3$), anorthite ($CaO.Al_2O_3.2SiO_2$), wollastonite ($CaSiO_3$), talc ($Mg_3Si_4O_{10}(OH_2)$), sillmanite ($Al_2SiO_5$), silicon nitride ($Si_3N_4$), aluminum oxynitride (AlON), $CaZrO_3$, AlN, $ZnO.SiO_2$, $ZrO_2$ and $ZrO_2.SiO_2$. The term "crystalline ceramic material" is not intended to include the various crystalline forms of silica ($SiO_2$) which include quartz, tridymite, flint and cristobalite. As stated above the presence of crystalline phases of silica, such as quartz and cristobalite, remain in the material during firing and on cooling and its presence in the fired product raises the TCE and lowers the mechanical strength of the product. Linear thermal expansion coefficients for polymorphoric forms of silica and glasses are shown in Table 1.

TABLE 1

| Composition | Thermal Coefficient of Expansion | | | |
|---|---|---|---|---|
| | 20°–100° C. | 20°–200° C. | 20°–300° C. | 20°–600° C. |
| Quartz | 11.2 | — | 13.2 | 23.7 |
| Cristobalite | 12.5 | — | 50.0 | 27.1 |
| Tridymite | 17.5 | — | 25.0 | 14.4 |
| Fused Silica Glass | — | 0.5 | — | — |
| High Silica Glass | — | 0.7 | — | — |
| Borosilicate Glass | — | 3.3 | — | — |

The term "finely divided" is used herein to describe material that is ground to less than about 5 microns in size.

The glasses can be prepared by conventional glass-making techniques by mixing the desired components in the desired proportions and heating the mixture to form melt. As is well known in the art, heating is conducted to a peak temperature and for a time such that the melt becomes entirely liquid and homogeneous.

The above-described glasses are particularly desirable for use in electronic packages, such as VLSI applications, because of their low polarizability and thus low dielectric constant. Because borosilicate glasses by themselves tend to have low softening points, it is necessary to increase the softening point by the addition of large amounts of other glasses which have high $SiO_2$ concentrations. High silica glasses are more durable than those with high $B_2O_3$ concentrations.

A preferred borosilicate glass comprises about 0–1 wt. % $Al_2O_3$, 25–30 wt. % $B_2O_3$, 0–1 wt. % CaO, 0–1 wt. % $K_2O$, 0–1 wt. % $Li_2O$, 0–1 wt. % $Na_2O$, 0–0.5 wt. % $ZnO.B_2O_2$ and 65–75 wt. % $SiO_2$. The amount of borosilicate glass used affects the sintering temperature. If too little borosilicate glass is used (for example, less than about 25 vol. % in this embodiment), the sintering temperature will be too high to achieve the benefits of the present invention. Maintaining the proportion of borosilicate glass within the range of about 25–50 vol. % is necessary to obtain these benefits.

A preferred high silica glass composition is sold under the tradename Corning 7913 and contains 0.5 wt. % alumina, 3 wt. %, $B_2O_3$, 96.5 wt. % $SiO_2$.

The following examples illustrate preferred ranges of components of the glass plus ceramic compositions of the invention. In each example, the borosilicate glass is comprised of 0.98 wt. % $Al_2O_3$, 26.7 wt. % $B_2O_3$, 0.11 wt. % CaO, 0.84 wt. % $K_2O$, 0.78 wt. % $Li_2O$, 0.2 wt. % $Na_2O$ and 69.8 wt. % $SiO_2$ and the high silica glass is Corning's 7913.

EXAMPLE 1

Figure 1:
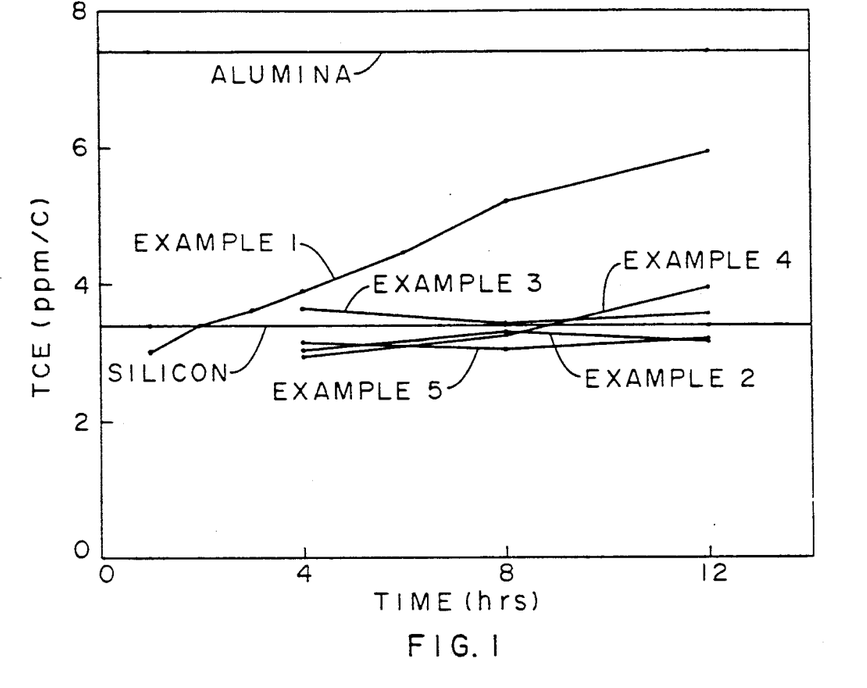
FIG. 1 is a graphical illustration of thermal coefficient of expansion (TCE) versus time.

In this example, the starting materials consisted essentially of 60 vol. % high silica glass and 40 vol. % borosilicate glass. The borosilicate glass and the high silica glass were separately ground in a 1.3 gallon ball mill for 16 hours to achieve a particle size of 2-4 microns. Since the density of the borosilicate glass and the high silica glass are approximately the same, the volume percent is roughly equivalent to the weight percent. In this example the actual weight percent of the mixture is 60.2 wt. % high silica glass and 39.8 wt. % borosilicate glass. This mixture of inorganic material was combined with 5 wt. % polyethylene glycol binder and 50 wt. % 1-propanol and mixed for 2 hours in a tubular mixer. The material was then oven dried at 80° C. for 2 hours and screened. The material was then dry pressed into 1.9 cm diameter, 0.3 cm high pellets by compressing the milled mixture in a mold at 13,000 psi (910 kg/cm$^2$). The pellets were then fired in air. The firing was in two steps. The first step was to burn the binder out. This was accomplished by heating the pellets to 500° C. and holding for 1 hour. Next the pellets were sintered isothermally at 900° C. for various times ranging from 1 to 12 hours. Thermal expansion coefficients (TCE) were determined in the temperature range from room temperature to 200° C. using a dilatometer. The results of the thermal expansion measurements were recorded in Table 2. TCE is found to increase from 3 ppm/c for 1 hour to 6 ppm/c for 12 hours. Fired materials were analyzed using X-ray diffraction and Table 3 reports the relative intensity of quartz (100) and cristobalite (100) peaks. The amount of quartz and cristobalite in the fired material is found to increase as the firing time increases. It is believed that the precipitation of quartz and cristobalite (see FIG. 2) causes the increase in TCE with firing period (see FIG. 1) because the TCE of quartz or cristobalite is much larger than those of borosilicate and high silica glasses (Table 1). Dielectric constant and dielectric loss were determined by an HP 4192 AC impedance at 1 MHz. The sintered density of the sintered materials was determined by the water replacement method, according to ASTM procedure C373-72. The dielectric constant (k') dissipation factor (DF) and sintered density of the fired compacts are reported in Table 4.

TABLE 2

| Example No. | Sintering Time (Hours) | TCE (ppm/°C.) RT-200° C. |
|---|---|---|
| 1 | 1 | 3.025 |
| 1 | 2 | 3.400 |
| 1 | 3 | 3.620 |
| 1 | 4 | 3.910 |
| 1 | 6 | 4.460 |
| 1 | 8 | 5.220 |
| 1 | 12 | 5.95 |
| 2 | 4 | 3.063 |
| 2 | 8 | 3.31 |
| 2 | 12 | 3.17 |
| 3 | 4 | 3.647 |
| 3 | 8 | 3.417 |
| 3 | 12 | 3.580 |
| 4 | 4 | 2.941 |
| 4 | 8 | 3.255 |
| 4 | 12 | 3.950 |
| 5 | 4 | 3.147 |
| 5 | 8 | 3.063 |
| 5 | 12 | 3.200 |

TABLE 3

| Example No. | Sintering Time (Hours) | Quartz (C/S) | Cristobalite (C/S) |
|---|---|---|---|
| 1 | 1 | 580 | 473 |
| 1 | 2 | 1051 | 573 |
| 1 | 3 | 1141 | 413 |
| 1 | 4 | 1528 | 640 |
| 1 | 6 | 2881 | 843 |
| 1 | 8 | 3324 | 855 |
| 1 | 12 | 3571 | 492 |
| 2 | 4 | 257 | 458 |
| 2 | 8 | 306 | N/D |
| 2 | 12 | 276 | N/D |
| 3 | 4 | 588 | 458 |
| 3 | 8 | 202 | 427 |
| 3 | 12 | 188 | N/D |
| 4 | 4 | 778 | 377 |
| 4 | 8 | 654 | 413 |
| 4 | 12 | 954 | 1306 |
| 5 | 4 | N/D | 511 |
| 5 | 8 | N/D | 221 |
| 5 | 12 | 347 | 544 |
| 6 | 4 | N/D | N/D |

C/S = count per second
N/D = not detected

TABLE 4

| Example No. | Sintering Time (Hours) | k' | D.F. (%) | % Density |
|---|---|---|---|---|
| 1 | 4 | 3.9-4.1 | 0.1-0.2 | 99.9 |
| 2 | 4 | 3.9-4.0 | <0.3 | 97.3 |
| 3 | 4 | 4.2-4.3 | 0.2-0.25 | 95.5 |
| 4 | 4 | 3.9-4.0 | 0.15-0.25 | 97.5 |
| 5 | 4 | 3.9-4.1 | <0.3 | 96.8 |

EXAMPLE 2

The procedure of Example 1 repeated except that the inorganic composition was 55 vol. % high silica glass, 40 vol. % borosilicate glass and 5 vol% alumina (53.0 wt. % and 38.2 wt. % and 8.8 wt. %, respectively) and the firing temperature was 925° C. The results of the thermal expansion measurements are shown in Table 2. It has been found that TCEs are very close to that of silicon and remain relatively unchanged from 4 to 12 hours (see FIG. 1). The fired materials were analyzed using X-ray diffraction and Table 3 reports the observed relative intensity of quartz (100) and cristobalite (100) peaks. As noted, the intensity of both quartz (100) and cristobalite (100) peaks do not change significantly as firing time increases (see FIG. 2). The dielectric constant (k'), dissipation factor (D.F.) and sintered density of the fired compacts are recorded in Table 4.

EXAMPLE 3

The procedure of Example 2 repeated except that the inorganic composition was 50 vol. % high silica glass, 40 vol. % borosilicate glass and 10 vol% alumina (46.4 wt. % and 36.8 wt. % and 16.8 wt. %, respectively). The results of the thermal expansion measurements are shown in Table 2. It has been found that TCEs are very close to that of silicon and remain relatively unchanged from 4 to 12 hours (see FIG. 1). The fired materials were analyzed using X-ray diffraction and Table 3 reports the observed relative intensity of quartz (100) and cristobalite (100) peaks. As noted, the intensity of both quartz (100) and cristobalite (100) peaks do not change significantly as firing time increases (see FIG. 2). The dielectric constant (k'), dissipation factor (D.F.) and sintered density of the material are recorded in Table 4.

EXAMPLE 4

The procedure of Example 2 repeated except that the inorganic composition was 50 vol. % high silica glass, 40 vol. % borosilicate glass and 10 vol % cordierite (49.3 wt. % and 39.1 wt. % and 11.6 wt. %, respectively). The results of the thermal expansion measurements are shown in Table 2. It has been found that TCEs are very close to that of silicon and remain relatively unchanged from 4 to 12 hours (see FIG. 1). The fired materials were analyzed using X-ray diffraction and Table 3 reports the observed relative intensity of quartz (100) and cristobalite (100) peaks. As noted, the intensity of both quartz (100) and cristobalite (100) peaks do not change significantly as firing time increases (see FIG. 2). The dielectric constant (k'), dissipation factor (D.F.) and sintered density of the material are recorded in Table 4.

EXAMPLE 5

The procedure of Example 2 repeated except that the inorganic composition was 50 vol. % high silica glass, 40 vol. % borosilicate glass and 10 vol % mullite (48.2 wt. % and 38.2 wt. % and 13.6 wt. %, respectively). The results of the thermal expansion measurements are shown in Table 2. It has been found that TCEs are very close to that of silicon and remain relatively unchanged from 4 to 12 hours (see FIG. 1). The fired materials were analyzed using X-ray diffraction and Table 3 reports the observed relative intensity of quartz (100) and cristobalite (100) peaks. As noted, the intensity of both quartz (100) and cristobalite (100) peaks do not change significantly as firing time increases (see FIG. 2). The dielectric constant (k'), dissipation factor (D.F.) and sintered density of the material are recorded in Table 4.

EXAMPLE 6

The procedure of Example 2 repeated except that the inorganic composition was 58 vol. % high silica glass, 40 vol. % borosilicate glass and 2 vol % alumina (57.3 wt. % and 39.1 wt. % and 3.6 wt. %, respectively). The fired materials were analyzed using X-ray diffraction and Table 3 reports the measured relative intensity of quartz (100) and cristobalite (100) peaks. No quartz or cristobalite is detected, indicating that the precipitation of quarts or cristobalite can be dramatically reduced with a small amount of alumina, 2 vol. %. The density and dielectric constants of the material of Example 6 were not measured.

Figure 2:
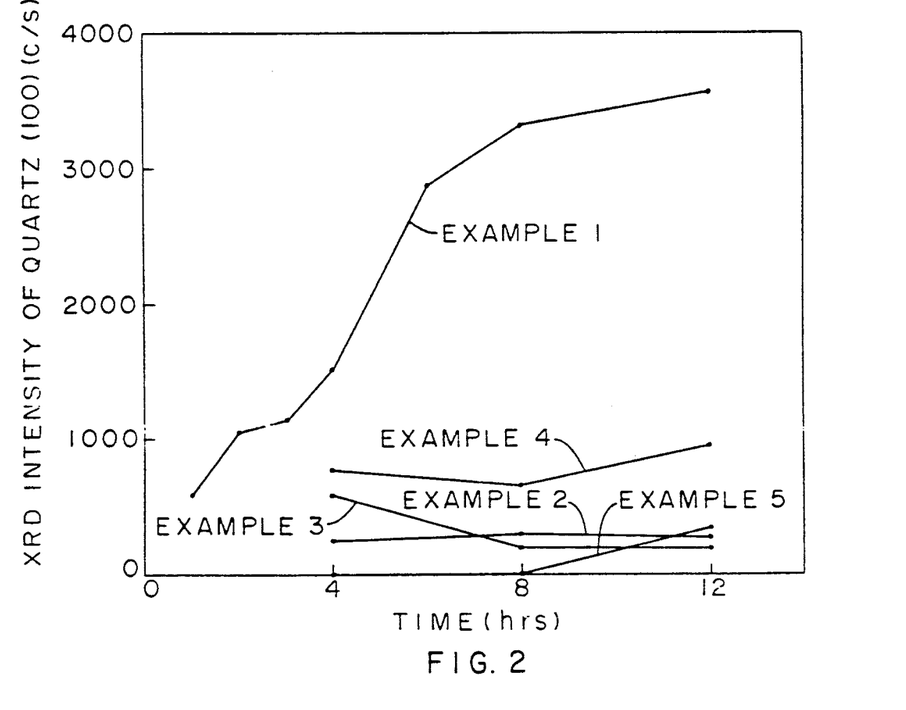
FIG. 2 is a graphical illustration of X-ray diffraction intensity of quartz (100) versus time.

The products of Examples 1-6 illustrate that the growth of quartz and cristobalite precipitate during firing can be dramatically reduced by the addition of a small amount of crystalline alumina or aluminosilicate material (see FIG. 2). This result is further demonstrated in that the TCE remains constant from 4 to 12 hours at 925° C. for the systems with crystallization inhibitors (see FIG. 1). Moreover, the TCE of the products of Examples 2-5 are very close to that of silicon (3.4 ppm/C), which is very desirable for multilayer ceramic packaging.

The products of Examples 2-6 contain a low glass content (25-50 vol. %) which is much less than those reported in the literature (greater than 60 vol. %). A low glass content is very desirable, because the shape distortion can be avoided during co-firing. The products of Examples 2-6 had high sintered densities (greater than 95% of the theoretical density) obtained at temperatures of 800°-950° C. in air. The sintering temperatures are compatible with those of precious metals, e.g., Au and Ag—Pd, which will enable the compositions to be utilized in a co-firable ceramic/metal electronic packaging system.

In addition, the material of Examples 2-6 have low dielectric constants (3.8-4.3 at 1 MHz) and low dielectric losses (0.1-0.4% at 1 MHz) which are very desirable to reduce the signal propagation delay in the ceramic substrate.

The materials of Examples 1-6 can be used to form multilayer high frequency circuit packages. To form dielectric layers for multilayer high frequency circuit packages, the starting materials are ground in a ball mill until they have an average particle size of 2-4 microns. A slurry is then formed by combining the finely ground powder with a suitable solvent and other conventional additives, such as a plasticizer and a binder, in a manner known in the art. The slurry is cast into thin "green" (unfired) sheets having a thickness of about 75 to 400 microns using a conventional doctor blading process, after which the green sheets are blanked into individual 125 mm square sheets or tapes. Via holes next are formed in the green sheets by a die punching process. The holes suitably may have a diameter of about 125 microns. A conductor paste is applied in a desired pattern to the punched sheets using a screen printing process. The paste is also applied within the via holes to form connections between conductor patterns. The principal metallic constituent of the paste may be gold, silver, copper, silver/palladium alloy, gold/platinum alloy, or other suitable materials. The printed green sheets are then stacked in a desired sequence using alignment holes to insure correct positioning, and laminated together at 50°-100° C. under a pressure between about 35 and 250 kg/cm$^2$. Finally, the laminated green sheets are fired at a temperature not exceeding 1000° C. to form dense, sintered ceramic multilayer circuit substrates. The firing may be done in air if the conductor metal is not susceptible to oxidation at the firing temperature. Such is the case, for example, with the metals named above, except for copper, which requires a reducing or neutral atmosphere. Sheets formed in the manner described will have a lower glass content (25-50 vol. %) and therefore a lower tendency to bow or warp.

The compositions of the present invention also can be used to form rigid, nonporous ceramic bodies by substantially conventional techniques. For example, the batch ingredients of any of the previous examples are combined with water and organic binders, and ball milled for a period of about 20 hours. The resulting slurry is spray dried to provide a powder of substantially spherical particles. This powder can be used to form bodies of various desired shapes by standard forming techniques, such as dry or isostatic pressing. The bodies are then fired at a suitable temperature not exceeding 1000° C. to provide dense, sintered ceramic objects.

Although the invention has been described in terms of a high silica glass, it is contemplated that other forms of silica may be used in practicing the present invention. However, it is not believed that quartz and/or cristobalite can be used because of their high TCE. In addition, it is not desirable to use fused silica that will devitrify when fired to temperatures of up to 1000° C.

Although the invention has been described in terms of using a crystalline alumina and aluminosilicate material as a crystal growth inhibitor, other forms of crystalline materials containing low levels of alkali ions may also be used in practicing the present invention.

Although applicants do not wish to be bound by any theories, it is presently believed that the mechanism of crystallization inhibition is related to the migration of alkali ions in the borosilicate glass to the interface with the crystallization inhibitor. Photomicrographs of microprobe have revealed that when alumina is used as a crystallization inhibitor, potassium and sodium ions in the borosilicate glass migrate toward the alumina/glass interface during firing of the mixture. At the same time $Al_2O_3$ migrates into the glass. It is believed that the segregation of alkali ions in the glass toward alumina/glass interface suppresses the tendency of the glass to undergo phase separation at or near the firing temperature of the mixture. This phase separation is believed to be a precursor to crystallization of the glass.

It is further believed that crystalline materials containing alkali ions will reduce the migration of the alkali ions in the borosilicate glass and thus reduce the inhibition of crystal growth that would otherwise be expected. Alkali ions such as potassium are known to increase the dielectric loss of ceramic, which is very undesirable. It is believed that materials that are for all practical purposes alkali-free, such as alumina ($Al_2O_3$), barium oxide (Bao), cordierite ($Mg_2Al_4Si_5O_{18}$), magnesium oxide (MgO), titania ($TiO_2$), mullite ($Al_6Si_2O_{13}$), magnesium titanate ($MgTiO_3$), spinel ($MgAl_2O_4$), forsterite ($2MgO.SiO_2$), steatite ($MgO.Si_2$), aluminum phosphate ($AlPO_4$), aluminum titanate ($Al_2TiO_5$), dolomite ($CaCO_3.MgCO_3$), anorthite ($CaO.Al_2O_3.2SiO_2$), wollastonite ($CaSiO_3$), talc ($Mg_3Si_4O_{10}(OH_2)$), sillmanite ($Al_2SiO_5$), silicon nitride ($Si_3N_4$), aluminum oxynitride (AlON), $CaZrO_3$, AlN, $ZnO.SiO_2$, $ZrO_2$ and $ZrO_2.SiO_2$, may be used as crystal growth inhibitors in practicing the present invention.

In addition, although the invention has been described in terms of using a 1-30 vol. % of a grain growth inhibitor, other amounts may also be used in practicing the present invention. The key is that enough crystalline material be used to cause the desired inhibition of crystal grain growth without introducing other undesirable properties. Thus, for example, if alumina is used as a grain growth inhibitor, a small addition (i.e. 5%) will produce the desired effect However, if a larger amount of alumina is used (i.e. 30%), the TCE of alumina ($7.4 \times 10^6/°C$. (in the 20°-200° C. range)) will raise the overall TCE for the fired body and the resulting mismatch in thermal expansion between the fired body and a silicon will result in design constraints and reliability concerns when attaching a silicon wafer to the fired body. If cordierite is used as a grain growth inhibitor, a larger amount (i.e. 30%) may be used since its TCE is $2.5 \times 10^6/°C$. (in the 20°-200° C. range).

It will be apparent to those skilled in the relevant art that various changes and modifications may be made in the embodiments described above to achieve the same or equivalent results without departing from the principles of the present invention as described and claimed herein. All such changes and modifications are intended to be covered by the following claims.

What is claimed is:

1. A ceramic composition for forming a ceramic dielectric body having a dielectric constant of less than about 4.2, said composition comprising a mixture of particles of:
   (a) 25-50 weight percent borosilicate glass;
   (b) 50-75 weight percent high silica glass comprising:
      0-1 wt. % alumina,
      3-4 wt. % $B_2O_3$, and
      95-98 wt. % $SiO_2$; and
   (c) 1-25 weight percent of crystalline ceramic material to inhibit the formation of crystalline forms of silica.

2. The ceramic composition of claim 1 in which said crystalline material is:
   1-25 weight percent of a crystalline aluminosilicate.

3. The ceramic composition of claim 1 in which said crystalline material is:
   1-25 weight percent of a material selected from the group of alumina, cordierite, mullite, magnesia, spinel, forsterite, steatite, aluminum phosphate ($AlPO_4$), aluminum nitride and aluminum titanate, barium oxide, titania, magnesium titanate, dolomite, anorthite, wollastonite, talc, sillmanite, silicon nitride, aluminum oxynitride, $CaZrO_3$, AlN, $MgO.Al_2O_3$, $ZnO.SiO_2$, $ZrO_2$ and $ZrO_2.SiO_2$.

4. The ceramic composition of claim 1 in which the borosilicate glass comprises:
   0-3 wt. % alumina, 20-30 wt. % $B_2O_3$, 0-3 wt. % CaO, 0-3 wt. % $K_2O$, 0-3 wt. % $Li_2O$, 0-3 wt. % $Na_2O$, and 60-80 wt. % $SiO_2$.

5. The ceramic composition of claim 1 wherein the formed ceramic dielectric body has a thermal expansion coefficient in the range of about 3.0-4.0 /°C.

6. The ceramic composition of claim 1 in which said mixture is dispersed in an organic medium, said organic medium being 31-80% of the total weight of said mixture and said organic medium, said organic medium comprising:
   (a) 1-10 wt. % polyethylene glycol binder; and
   (b) 30-70 wt. % 1-propanol.

7. A castable ceramic composition having a dielectric constant of less than about 4.2, comprising:
   (a) mixture of 25-50 weight percent borosilicate glass and 50-75 weight percent high silica glass having the composition:
      0-1 wt. % alumina;
      3-4 wt. % $B_2O_2$, and
      95-98 wt. % $SiO_2$;
   (b) 15-30 wt. % of an organic medium comprising:
      1-10 wt. % polyethylene glycol binder; and
      30-70 wt. % 1-propanol; and
   (c) 1-25 weight percent of crystalline ceramic material to inhibit the formation of crystalline forms of silica.

8. The castable ceramic composition of claim 7 in which said crystalline material is:
   1-30 volume percent of a crystalline aluminosilicate.

9. The ceramic composition of claim 7 in which said crystalline material is:
   1-25 percent of a material selected from the group of alumina, cordierite, mullite, magnesia, spinel, forsterite, steatite, aluminum phosphate ($AlPO_4$), aluminum nitride and aluminum titanate, barium oxide, titania, magnesium titanate, dolomite, anorthite, wollastonite, talc, sillmanite, silicon nitride, aluminum oxynitride, $CaZrO_3$, AlN, $MgO.Al_2O_3$, $ZnO.SiO_2$, $ZrO_2$ and $ZrO_2.SiO_2$.

10. A method of making a ceramic dielectric body having a dielectric constant of less than about 4.2, comprising the steps of:
    (a) providing a mixture consisting essentially of finely divided particles comprising:
       i. 25-50 wt. % borosilicate glass comprising:
          0-3 wt. % alumina,
          20-30 wt. %, $B_2O_3$,
          0-3 wt. % CaO,
          0-3 wt. % $K_2O$, 0-3 wt. % Li$_2$O,
0-3 wt. % Na$_2$O, and
60-80 wt. % SiO$_2$; and
ii. 50-75 wt. % high silica glass comprising:
0-1 wt. % alumina,
3-4 wt. % B$_2$O$_3$,
95-98 wt. % SiO$_2$, and
iii. 1-25 weight percent of crystalline ceramic material to inhibit the formation of crystalline forms of silica; and
(b) sintering the mixture in air to a temperature not greater than about 1000° C.

11. The method of claim 10 in which said step of providing a mixture includes:
(a) providing a mixture consisting essentially of finely divided particles comprising:
25-50 wt. % borosilicate glass,
50-75 wt. % high silica glass comprising:
0-1 wt. % alumina,
3-4 wt. % B$_2$O$_3$,
95-98 wt. % SiO$_2$; and
1-25 wt. % of a crystalline aluminosilicate.

12. The method of claim 10 in which said step of providing a mixture includes:
providing a mixture consisting essentially of finely divided particles comprising:
25-50 wt. % borosilicate glass,
50-75 wt. % high silica glass comprising:
0-1 wt. % alumina,
3-4 wt. % B$_2$O$_3$,
95-98 wt. % SiO$_2$, and
1-25 weight percent of a material selected from the group of alumina, cordierite, mullite, magnesia, spinel, forsterite, steatite, aluminum phosphate (AlPO$_4$), aluminum nitride and aluminum titanate, barium oxide, titania, magnesium titanate, dolomite, anorthite, wollastonite, talc, sillmanite, silicon nitride, aluminum oxynitride, CaZrO$_3$, AlN, MgO.Al$_2$O$_3$, ZnO.SiO$_2$, ZrO$_2$ and ZrO$_2$.SiO$_2$.

13. A ceramic composition for forming a ceramic dielectric body having a dielectric constant of less than about 4.2 and a thermal expansion coefficient of less than about 4.0 ppm/°C. said composition comprising a mixture of particles of:
(a) 25-50 weight percent borosilicate glass;
(b) 50-75 weight percent high silica glass comprising:
0-1 wt. % alumina,
3-4 wt. % B$_2$O$_3$, and
95-98 wt. % SiO$_2$; and
(c) 1-25 weight percent of crystalline ceramic material to inhibit the formation of crystalline forms of silica.

14. A ceramic composition for forming a ceramic dielectric body having a dielectric constant of less than about 4.2, said composition comprising a mixture of particles of:
(a) 25-50 weight percent borosilicate glass;
(b) 50-75 weight percent high silica glass comprising:
0-1 wt. % alumina,
3-4 wt. % B$_2$O$_3$, and
95-98 wt. % SiO$_2$; and
(c) 1-25 weight percent of crystalline ceramic material selected from the group of alumina, cordierite, spinel and combinations therof.

* * * * *

UNITED STATES PATENT AND TRADEMARK OFFICE
CERTIFICATE OF CORRECTION

PATENT NO. : 5,079,194

DATED : January 7, 1992

INVENTOR(S) : Jau-Ho Jean et al

It is certified that error appears in the above-identified patent and that said Letters Patent is hereby corrected as shown below: On the Title page, item, [57],

| | |
|---|---|
| Abstract, line 11 | Change "$B_2O$" to --$B_2O_3$--. |
| Col. 1, line 49 | Change "$7.4 \times 10^6/°C$" to --$7.4 \times 10^{-6}/°C$--. |
| Col. 1, line 50 | Change "$3.4 \times 10^6/°C$" to --$3.4 \times 10^{-6}/°C$--. |
| Col. 2, line 53 | Change "$4.2 \, cm/cm/°C_6 \times 10^6$" to --$4.2 \, cm/cm/°C \times 10^{-6}$--. |
| Col. 5, line 46 | Change "$50 \times 10^6/°C$" to --$50 \times 10^{-6}/°C$--. |
| Col. 5, line 47 | Change "$13 \times 10^6/°C$" to --$13 \times 10^{-6}/°C$--. |
| Col. 5, line 48 | Change "$3.5 \times 10^6/°C$" to --$3.5 \times 10^{-6}/°C$--. |
| Col. 6, line 45 | Change "$B_2O_2$" to --$B_2O_3$--. |
| Col. 11, line 44 | Change "$7.4 \times 10^6/°C$" to --$7.4 \times 10^{-6}/°C$--. |
| Col. 11, line 51 | Change "$2.5 \times 10^6/°C$" to --$2.5 \times 10^{-6}/°C$--. |

UNITED STATES PATENT AND TRADEMARK OFFICE
CERTIFICATE OF CORRECTION

PATENT NO. : 5,079,194

DATED : January 7, 1992

INVENTOR(S) : Jau-Ho Jean et al

It is certified that error appears in the above-identified patent and that said Letters Patent is hereby corrected as shown below:

Claim 7, Col. 12, lines 35-36     Delete "having the composition" and insert --comprising--.

Claim 7, Col. 12, line 38     Change "$B_2O_2$" to --$B_2O_3$--.

Claim 8, Col. 12, line 48     Change "volume" to --weight--.

Claim 9, Col. 12, line 51     After "1-25" insert --weight--.

Signed and Sealed this

Fifteenth Day of June, 1993

Attest:

MICHAEL K. KIRK

Attesting Officer     Acting Commissioner of Patents and Trademarks